United States Patent [19]

Lock et al.

[11] Patent Number: 4,821,864
[45] Date of Patent: Apr. 18, 1989

[54] PIN FEEDING APPARATUS

[75] Inventors: Brian E. Lock, Princeton; John G. Aceti, Princeton Jct., both of N.J.

[73] Assignee: General Electric Company, Schenectady, N.Y.

[21] Appl. No.: 151,292

[22] Filed: Feb. 1, 1988

[51] Int. Cl.[4] ............................................. B65G 47/10
[52] U.S. Cl. .................................... 198/368; 198/389; 198/463.6; 198/418.1; 221/94; 221/165
[58] Field of Search .............. 198/389, 368, 420, 424, 198/463.6; 221/94, 159, 165; 53/247, 539

[56] References Cited

U.S. PATENT DOCUMENTS

| 289,360 | 11/1883 | Sullivan | 198/463.6 |
|---|---|---|---|
| 1,409,801 | 3/1922 | Twomley | 221/94 |
| 1,947,770 | 2/1934 | MacKenzie | 198/389 |
| 2,155,568 | 4/1939 | Standish et al. | 221/165 |
| 3,133,623 | 5/1964 | Collins et al. | 198/424 |
| 3,713,527 | 1/1973 | Ginther | 198/389 |
| 4,174,028 | 11/1979 | Barnes | 198/389 |

FOREIGN PATENT DOCUMENTS 1227417 4/1986 U.S.S.R. ........................... 198/463.6

Primary Examiner—Joseph E. Valenza

Attorney, Agent, or Firm—Birgit E. Morris; Ernest F. Chapman

[57] ABSTRACT

An apparatus for feeding headed pins includes a frame having thereon a hopper into which the pins are placed. A ramp extends substantially horizontally from the hopper and has a plurality of spaced, parallel slots therein which are adapted to receive the pins with the heads of the pins seated on the surface of the ramp. At the end of the ramp is a transfer shuttle assembly which is adapted to feed pins from the slots into passages in a chute which extends vertically downwardly from the end of the ramp. The upper ends of the passages are offset from the ends of the slots. The shuttle transfer means includes a shuttle plate movable back and forth across the end of the ramp by means of pneumatic cylinders, and a plurality of gates mounted on the shuttle plate. Each gate has a notch in its end which can receive a pin. The shuttle plate is moveable between a position in which the notches in the gates are aligned with the slots so as to receive a pin, and a position in which the notches in the gates are over a passage in the chute. The gates are individually movable toward and away from the end of the ramp by individual pneumatic cylinders connected to the gates. When the gates are over the passages in the chute, they can be moved away from the end of the ramp to drop the pins down the chute.

14 Claims, 5 Drawing Sheets

PIN FEEDING APPARATUS

FIELD OF THE INVENTION

The present invention relates to an apparatus for feeding headed pins into a holder, and, more particularly, to such an apparatus which can selectively vary the number and position of the pins fed to the holder.

BACKGROUND OF THE INVENTION

Integrated circuit elements are generally mounted on a support which includes a body of an insulating material having a plurality of terminal pins molded in the body and projecting therefrom. The number of pins and their arrangement depends on the number and arrangement of the contact pads on the integrated circuit element. The number of pins required may be at least twelve and generally many more. The support is generally formed by placing the pins, which have a head on one end, into appropriate holes in a heated mold with the heads of the pins extending into the cavity for molding the body. The body is then molded around the heads of the pins either by compression or injection molding.

In our co-pending application for U.S. patent Ser. No. 151,291, filed Feb. 1, 1988 entitled PIN TRANSFER APPARATUS, there is disclosed an apparatus whereby a desired number and arrangement of the headed pins can be easily and quickly transferred into a mold cavity. The transfer apparatus of this application includes three stacked plates having a plurality of aligned holes therethrough. The middle plate is movable with respect to the outer two plates between a first position in which its holes are aligned with the holes in the outer plates, and a second position in which its holes are not completely aligned with the holes in the outer plates. With the middle plate in its second position, pins can be inserted through the holes in the plates but the heads of the pins will not pass through the hole in the middle plates. Thus the pins will be supported in the transfer apparatus. When the middle plate is moved to its first position, the heads of the pins can pass through the completely aligned holes so that the pins can fall from the transfer apparatus into the mold cavity to which the pins are being transferred. The holes in the plates are arranged in rows with some of the rows containing a different number of holes than other rows.

Although the pins can be inserted into the holes in the plates manually, this is a time consuming and therefore expensive operation. Therefore, it would be desirable to have an apparatus which would automatically feed the pins into the transfer apparatus. In addition, it would be desirable to be able to feed the pins into the transfer apparatus a row at a time and be able to selectively vary the number and position of the pins being fed into each row.

SUMMARY OF THE INVENTION

An apparatus for feeding headed pins includes a hopper having a substantially horizontal base and side walls extending upwardly from around a portion of the base so that the hopper has an open portion. A horizontal ramp extends from the base at the open portion. The ramp has a plurality of spaced, parallel slots therein extending to the end thereof away from the hopper. The slots are of a depth and width substantially equal to the length and diameter of the pins but the width of the slots is less than the diameter of the heads of the pins so that the pins can fit into the slots with the heads of the pins resting on the surface of the ramp. A chute extends vertically downward from the end of the ramp. The chute has a plurality of passages therethrough with the upper end of each passage being slightly off-set from the end of a slot in the ramp. The passages are larger than the diameter of the pin heads so that the pins can slide down the passages. At the ends of the slots in the ramp are means for selectively allowing pins from desired slots to drop into the adjacent passages of the chute.

DETAILED DESCRIPTION OF PREFERRED EMBODIMENT

Figure 1:
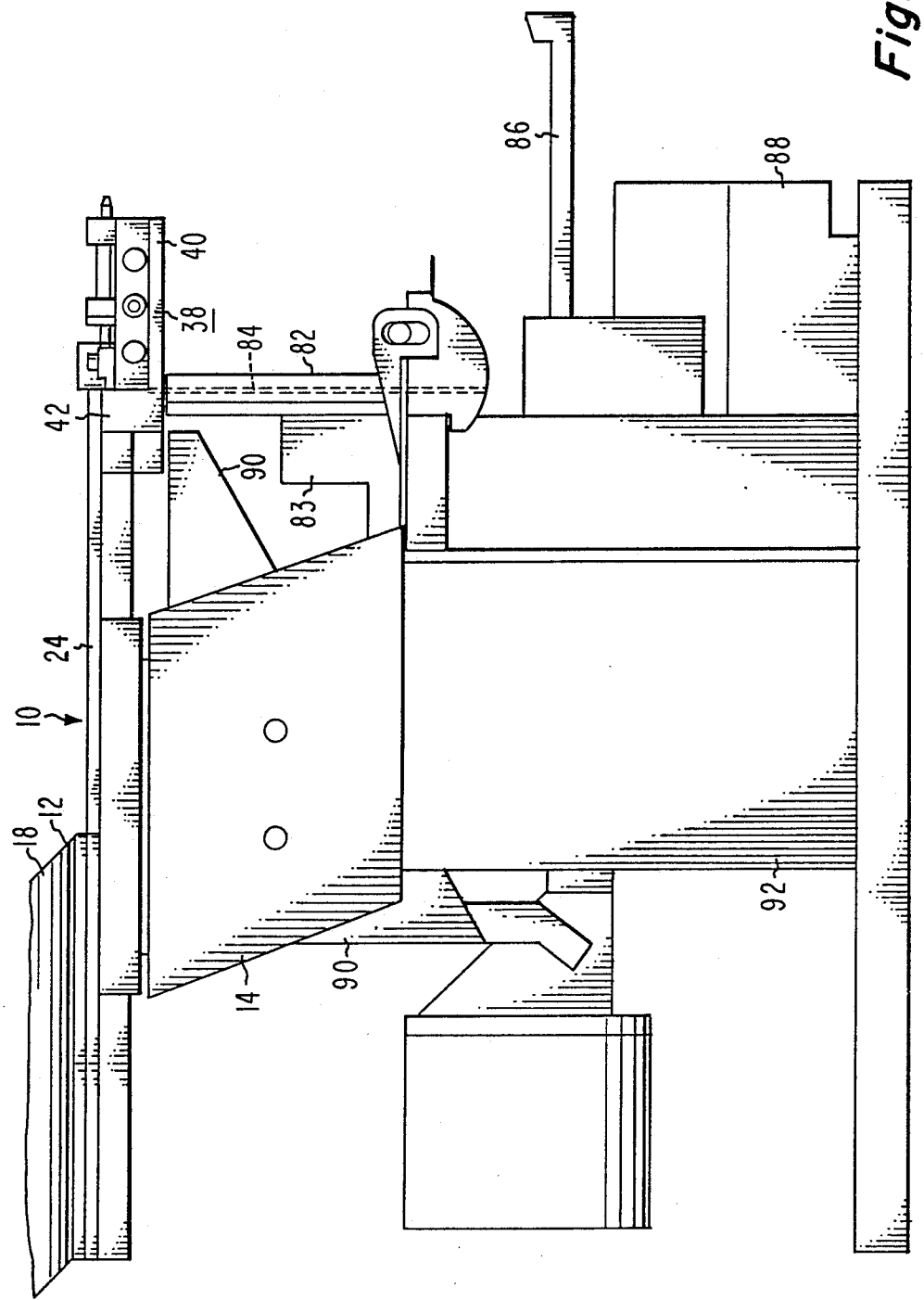
FIG. 1 is a top elevational view of the pin feeding apparatus of the present invention.
Figure 2:
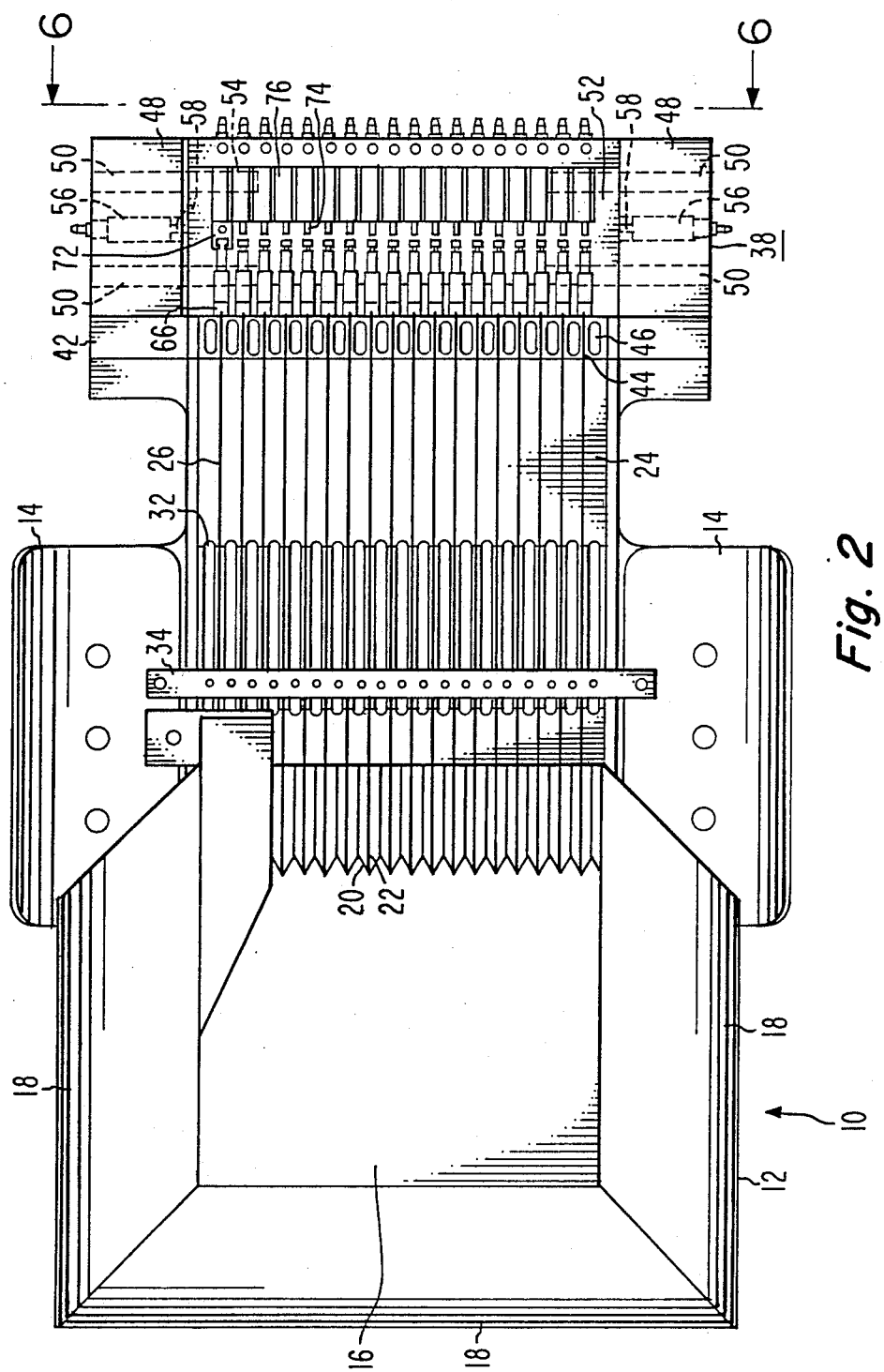
FIG. 2 is a side elevational view of the apparatus of the present invention.

Referring initially to FIGS. 1 and 2, the pin feeding apparatus of the present invention is generally designated as 10. Pin feeding apparatus 10 includes a hopper 12 mounted on a vibrator 14. The hopper 12 has a rectangular, substantially flat, horiztonal bottom 16, and sides walls 18 extending upwardly from the side and back edges of the bottom 16 leaving the front of the hopper 12 open. The bottom 16 has a plurality of parallel, V-shaped notches 20 extending longitudinally along a portion thereof from the front open end of the hopper 12, and a slot 22 extending along the bottom of each notch 20. The slots 22 are of a depth and width equal to the length and diameter of the pins with the width of the slots 22 being smaller than the diameter of the heads of the pins so that a pin can enter the slot 22 with the head being seated on the sides of the notches 20.

Figure 3:
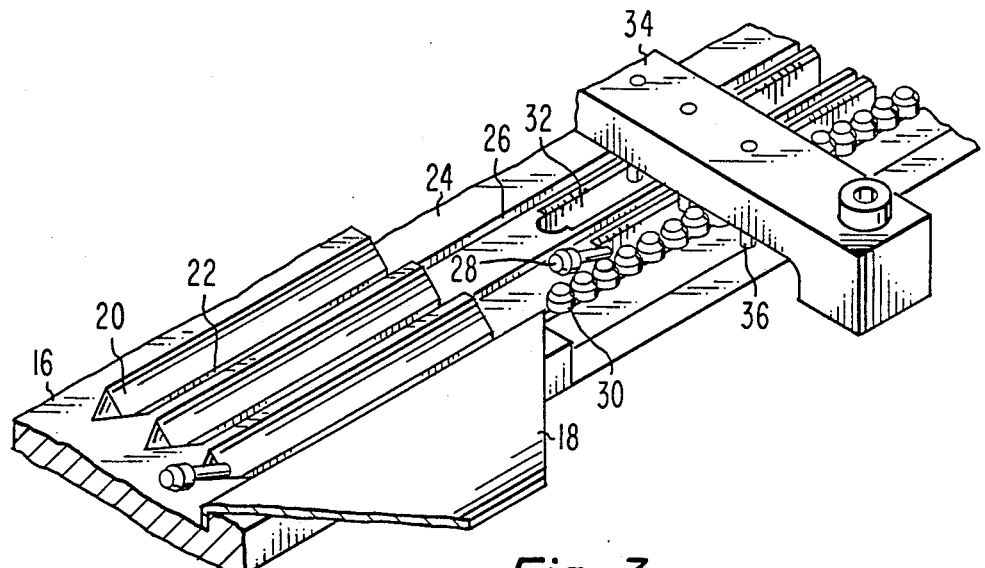
FIG. 3 is an enlarged perspective view of a portion of the hopper and ramp of the apparatus of the present invention.

A horizontal ramp 24 is mounted on the vibrator 14 and extends from the front open edge of the bottom 16 of the hopper 12. The ramp 24 has a plurality of spaced, parallel slots 26 extending the full length of the ramp 24 with each slot 26 being aligned with a slot 22 in the hopper bottom 16. The slots 26 are of the same depth and width as the slots 22 so that a pin 28 can fit into slots 26 with the head 30 of the pin 28 being seated on the top surface of the ramp 24 as shown in FIG. 3. Adjacent the end of the ramp 24 at the hopper 12 are a plurality of elongated openings 32 extending through the ramp in the areas of the ramp at each side of each slot 26. A bridge 34 extends transversely across and is spaced from the ramp 26 adjacent the ends of the openings 32 near the hopper 12. The ends of the bridge 34 are seated on and secured to the vibrator 14 as shown in FIG. 3. Also as shown in FIG. 3, a plurality of pins 36 extend downwardly from the bridge 34 with each pin 36 being over a separate one of the openings 32.

Figure 4:
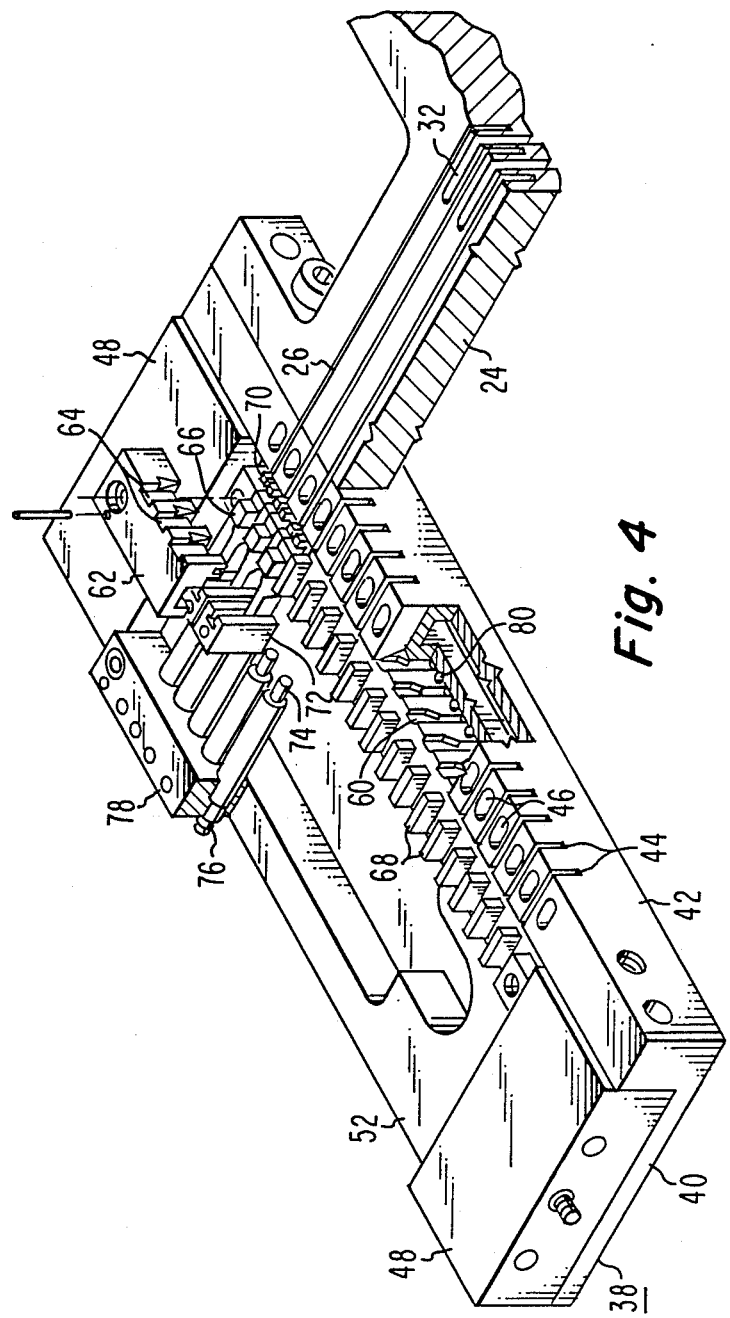
FIG. 4 is an enlarged perspective view, partially broken away, of the means for selectively transferring pins from the ramp to the chute.

A transfer shuttle assembly 38 is mounted across the end of the ramp 24. As shown in FIG. 4, The transfer shuttle assembly 38 includes a support plate 40 having a thicker mounting bar 42 extending across one end thereof. The mounting bar 42 extends across and is secured to the end of the ramp 24. The mounting bar 42 has a plurality of spaced, parallel slots 44 extending thereacross with each slot 44 being in alignment with a separate slot 26 in the ramp 24. The slots 44 are of the same depth and width as the slots 26 so as to be extensions of the slots 26. A plurality of spaced openings 46 extend through the bar 42 with the openings 46 being on each side of each slot 44.

A mounting block 48 is seated on the support plate 40 at each side thereof. As shown in FIG. 2, a pair of spaced bearing rods 50 project from each mounting block 48 toward the other block 48. A shuttle plate 52 is on the support plate 40 between the mounting blocks 48. The bearing rods 50 extend into holes 54 in the sides of the shuttle plate 52 so that the shuttle plate 52 is slidably mounted on the rods 50. The shuttle plate 52 is slightly narrower than the space between the mounting blocks 48 so that the shuttle plate 52 can move slightly transversely across the bar 42. A pneumatic cylinder 56 is mounted in each mounting block 48 and has a piston 58 extending therefrom and connected to the shuttle plate 52 so that the pneumatic cylinders 56 can move the shuttle plate 52 back and forth across the bar 42. The shuttle plate 52 has a plurality of spaced notches 60 in its edge facing the bar 42. The shuttle plate 52 is movable between a position in which each of the notches 60 is aligned with a separate slot 44 in the bar 42, and a position in which the notches 60 are offset slightly from the slots 44.

As shown in FIG. 4, a shuttle bar 62 extends transversely across and is spaced from the edge of the shuttle plate 52 having the notches 60 therein. The shuttle bar 62 has a plurality of notches 64 in its edge facing the bar 42 with each notch 64 being over and aligned with a separate notch 60 in the shuttle plate 52. However, the notches 64 are wider than the notches 60 and are wide enough to receive the head 30 of a pin 28.

As shown in FIGS. 4 and 5, a plurality of gates 66 are mounted on the shuttle plate 52 along its edge at the bar 42 and under the shuttle bar 62. Each gate 66 is aligned with a separate notch 64 in the shuttle bar 62 and is slidable toward and away from the bar 42 between spaced guides 68 projecting upwardly from the shuttle plate 52. Each gate 66 has a notch 70 in its end facing the bar 42 with the notch being of the same width as the slots 44 in the bar 42. The other end of each gate 66 is connected to a link 72 which is mounted on the end of a piston 74 of a pneumatic cylinder 76. The cylinders 76 are mounted in parallel relation on a mounting bar 78 extending across and secured to the shuttle plate 52 along its edge away from the bar 42.

Figure 6:
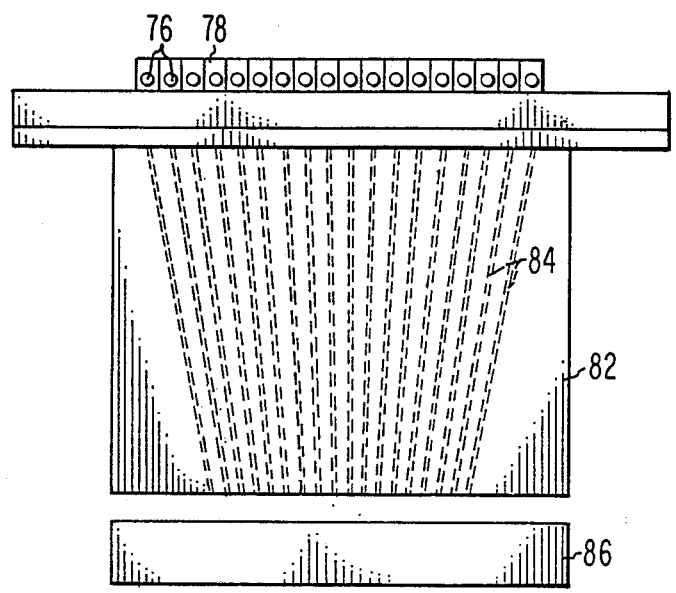
FIG. 6 is a front elevational view of a portion of the apparatus of the present invention.

As shown in FIG. 4, the support plate 40 has a plurality of holes 80 therethrough spaced along the edge of the bar 42. Each of the holes is slightly offset from a separate slot 44 in the bar 42 and is of a diameter equal to the diameter of the pin head 30 so that a pin 28 can pass completely through each hole 80. As shown in FIG. 1, a vertically extending chute 82 is mounted on a block 83 beneath the support plate 40. The chute 82 has a plurality of passages 84 therethrough with the upper end of each passage 84 being aligned with a separate hole 80 in the support plate 40. Each of the passages 84 is of a diameter at least equal to the diameter of the pin head 30 so that a pin 28 can drop completely through each passage 84. As shown in FIG. 6, the passages 84 are angled toward each other as they extend downwardly so that the passages 84 are closer together at their bottom ends than at their top ends. This is to accommodate the spacing of the pin 28 in the holder into which they are being fed. However, if the spacing of the pins 28 in the holder is larger, the passages 84 could, extend straight downwardly.

Extending horizontally under the bottom end of the chute 82 is a support 86 for the holder which is to receive the pins 28. The support 86 is mounted on a slide 88 so that the holder can be selectively moved under the chute 82 to bring rows of holes in the holder directly under the bottom end of the chute 82 one at a time so that the pins 28 can be fed into the row of holes. A funnel 90 is mounted on the non-vibrating frame of the vibrator 14 under the ramp 24 and the bar 42 so that the funnel 90 is under the openings 32 and 46 in the ramp 24 and bar 42 respectively. Thus, the funnel 90 is adapted to receive any pin 28 that may drop through the openings 32 and 46 and feed them to a container at the end of the funnel 90. The vibrator 14 is mounted on a frame 92 and operates to cause the hopper 12 and ramp 24 to vibrate in a manner to move the pins 28 from the hopper 12 and down the ramp 24.

Figure 5C:
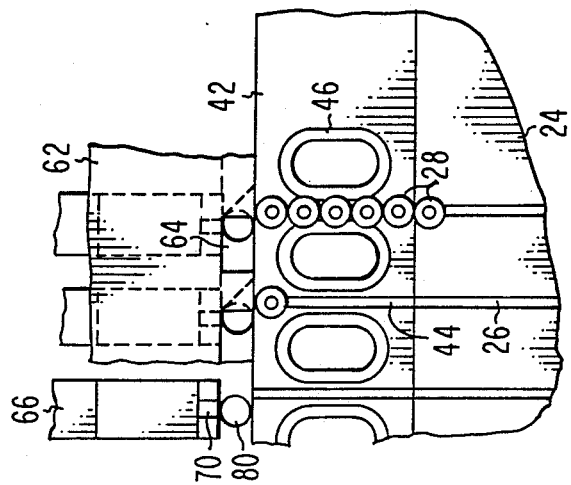
FIGS. 5a, 5b and 5c are enlarged views showing how the transfer means operates for transferring pins from the ramp to the chute.
Figure 5B:
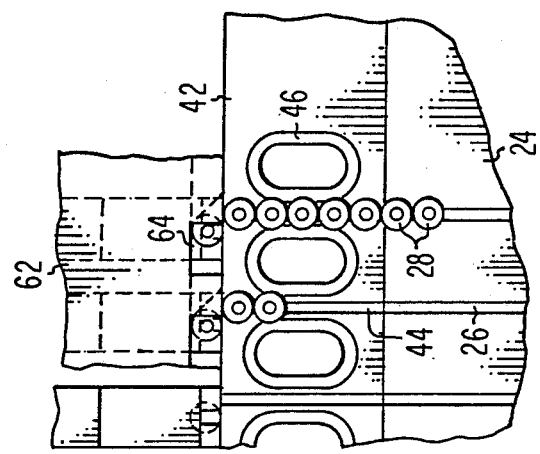
Figure 5A:
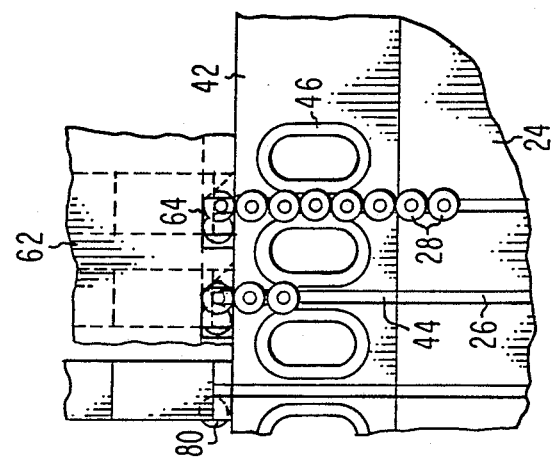

In the operation of the apparatus 10, a plurality of pins 28 are dropped into the hopper 12. The vibrator 14 moves the pins 28 toward the ramp 24. When the pins 28 reach the V-shaped notches 20, some of them will drop into the notches 20 and then into the slots 22. These pins 28 will then slide down the slots 26 in the ramp 24 with the heads 30 of the pins resting on the surface of the ramp 24 as shown in FIG. 3. As shown in FIG. 5a, the pins 28 in the slots 26 will be stopped when the first pin 28 reaches the shuttle plate 52. The pins 28 that do not fall into a slot 24 will fall into an opening 32 in the ramp 24 and will drop into the funnel 90. These pins 28 will be collected in the container and returned into the hopper 12. Some of the pins 28 may be extending transversely across the notches 20 and therefore will not fall into a slot 26. When these pins 28 reach the bridge 34 they will be engaged by a pin 36 extending from the bridge 34 which will turn the pin 28 causing it to either fall into a slot 26 or drop into an opening 32. It is possible that some pins 28 may not drop either into a slot 26 or an opening 32, and will continue down the surface of the ramp 24. When these pins 28 reach the end of the ramp 24, they will drop into the openings 46 in the bar 42 and will drop into the funnel 90.

As shown in FIG. 5a, when the pins 28 reach the shuttle plate 52, the first pin 28 in each slot 44 in the bar 42 will be in the notches 60 and 70 in the shuttle plate 52 and gate 66 respectively with the head 30 of the pin 28 fitting into the aligned notch 64 in the shuttle bar 62. The pneumatic cylinders 56 are then operated to move the shuttle plate 52 slightly sideways until the pins 28 are over the holes 80 in the support plate 40 as shown in FIG. 5b. This moves the first pins 28 away from the other pins in each slot 44 so as to relieve the first pins from the force of the entire row of pins. The pneumatic cylinders 76 are then operated to move the gates 66 away from the bar 42 as shown in FIG. 5c. This releases the heads 30 of the pins 28 so that the pins 28 drop through the holes 80 in the support plate 40 and through the passages 84 in the chute 82 to the holder mounted beneath the chute 82. The pins 28 will drop into the holes in the holder which are aligned with the passages 84 in the chute.

The pneumatic cylinders 76 are then operated to move the gates 66 back to their initial positions and the pneumatic cylinders 56 are operated to move the shuttle plate 52 back to its initial position where another row of pins 28 can enter the shuttle plate 52. The holder can then be moved to bring another row of holes therein into alignment with the chute 82 and the operation can be repeated to feed another row of pins 28 to the holder. By controlling the number of the pneumatic cylinders 76 which are operated, the number of gates 66 which are operated can be controlled to vary the number of pins 28 which are dropped into the holder during each cycle of the operation. Similarly, the position of the pins 28 which are dropped into the holder can be controlled according to which of the pneumatic cylinders 76 are operated during each cycle.

Thus, there is provided by the present invention a pin feeding apparatus 10 which automatically feeds rows of headed pins 28 into a holder. The apparatus 10 allows a control of both the number of pins 28 which are fed to the holder during each cycle and the position of the pins 28 which are fed. Also, the apparatus operates quickly and easily to allow the holder to be completely filled with the pins 28 relatively quickly and inexpensively.

We claim:

1. An apparatus for feeding headed pins comprising:
   a hopper including a substantially horizontal base and side walls extending upwardly from around a portion of the base so that the hopper has an open portion;
   a ramp extending from the base of the hopper at the open portion of the hopper, said ramp having a plurality of spaced, parallel slots therein extending to the end of the ramp away from the hopper, said slots being of a depth and width substantially equal to the length and diameter of the pins but narrower than the diameter of the heads of the pins so that the pins can fit into the slots with the heads of the pins seated on the surface of the ramp;
   a chute extending vertically downwardly from the said end of the ramp, said chute having a plurality of vertical passages therethrough with the upper end of each passage being adjacent but offset from the end of a separate slot in the ramp and being of a size at least as large as the diameter of the heads of the pins so that the pins can slide down the passages;
   a single shuttle plate mounted across the end of the ramp and across all of the slots;
   a plurality of gates mounted on said shuttle plate, each of said gates having a notch in its end facing the ramp for receiving a pin;
   means for moving said shuttle plate between a position in which the gates are aligned with the slots and a position in which the gates are over the passages in the chute; and
   means for selectively sliding the gates away from the ramp to selectively drop a pin down a passage in the chute.

2. Apparatus in accordance with claim 1 in which the means for moving said gates includes a separate pneumatic cylinder connected to each gate and mounted on said shuttle plate.

3. Apparatus in accordance with claim 2 including a support plate extending from the end of the ramp and having a mounting bar along one end secured to the end of the ramp, said mounting bar having a plurality of slots extending thereacross, each of which is in alignment with a separate slot in the ramp, and the shuttle plate is slidably mounted on said support plate along said mounting bar.

4. Apparatus in accordance with claim 3 including a shuttle bar extending over and across the gates and mounted at its ends on the shuttle plate, said shuttle bar having a plurality of notches in its edge facing the mounting bar with each notch being aligned with the notch in a separate gate, the notches in the shuttle bar being wide enough to receive the head of a pin.

5. Apparatus in accordance with claim 3 in which the support plate has a plurality of holes therethrough adjacent the mounting bar, each of said holes being aligned with a separate passage in the chute.

6. Apparatus in accordance with claim 5 in which the means for moving the shuttle plate includes a separate pneumatic cylinder at each side of the shuttle plate and connected to the shuttle plate for moving it transversely across the mounting bar.

7. Apparatus in accordance with claim 6 including a separate mounting block at each side of the support plate, the pneumatic cylinders are mounted in the blocks and the shuttle plate is movable back and forth between the blocks.

8. Apparatus in accordance with claim 7 including a pair of spaced bearing rods projecting from each mounting block and slidably extending into holes in the sides of the shuttle plate so that the shuttle plate is slidably supported on said rods.

9. Apparatus in accordance with claim 3 including a plurality of elongated openings through said ramp adjacent the hopper with said openings being on opposite sides of the slots so that the pins which do not fall into the slots will fall through said openings.

10. Apparatus in accordance with claim 9 including a bridge extending across and spaced from said ramp adjacent the hopper, and pins extending downwardly from said bridge with each pin being over one of said openings.

11. Apparatus in accordance with claim 10 including a plurality of openings through said mounting block with said openings being on opposite sides of the slots in the mounting block.

12. Apparatus in accordance with claim 11 including a funnel mounted under said ramp and said mounting block to catch any pins which may fall through the openings in the ramp and mounting block.

13. Apparatus in accordance with claim 1 including a vibrator connected to the hopper and the ramp for moving the pins along the hopper to the ramp and along the ramp.

14. Apparatus in accordance with claim 1 including a support under the chute for a holder into which the pins are being fed, said support being movable under the bottom of the chute so as to be able to change the position of the holder under the chute.

* * * * *